(12) United States Patent
Han et al.

(10) Patent No.: US 10,883,173 B2
(45) Date of Patent: Jan. 5, 2021

(54) GAS STORAGE CYLINDER, DEPOSITION SYSTEM, AND METHOD OF MANUFACTURING SEMICONDUCTOR DEVICE

(71) Applicant: SAMSUNG ELECTRONICS CO., LTD., Suwon-si (KR)

(72) Inventors: Yeonock Han, Hwaseong-si (KR); Wonwoong Chung, Suwon-si (KR); Keum Seok Park, Seoul (KR); Pankwi Park, Incheon (KR); Jeongho Yoo, Seongnam-si (KR); Younjoung Cho, Hwaseong-si (KR); Byung Koo Kong, Yeongju-si (KR); Mijeong Kim, Yeongju-si (KR); Jin Wook Lee, Yeongju-si (KR); Changeun Jang, Yeongju-si (KR)

(73) Assignee: SAMSUNG ELECTRONICS., LTD., Suwon-si (KR)

( * ) Notice: Subject to any disclaimer, the term of this patent is extended or adjusted under 35 U.S.C. 154(b) by 5 days.

(21) Appl. No.: 16/200,149

(22) Filed: Nov. 26, 2018

(65) Prior Publication Data
US 2019/0309415 A1 Oct. 10, 2019

(30) Foreign Application Priority Data
Apr. 6, 2018 (KR) .................. 10-2018-0040089

(51) Int. Cl.
| F17C 1/00 | (2006.01) |
| F17C 13/02 | (2006.01) |
| C23C 16/448 | (2006.01) |
| H01L 21/02 | (2006.01) |

(52) U.S. Cl.
CPC ............ *C23C 16/448* (2013.01); *F17C 1/005* (2013.01); *F17C 13/02* (2013.01); *H01L 21/0254* (2013.01); *H01L 21/0262* (2013.01); *H01L 21/02458* (2013.01); *H01L 21/02491* (2013.01); *H01L 21/02642* (2013.01)

(58) Field of Classification Search
CPC .... F17C 1/005; F17C 1/12; F17C 1/16; F17C 13/002; F17C 13/04; C23C 16/448
USPC ............... 220/586, 581, 62.17, 62.22, 62.11; 206/0.7, 0.6
See application file for complete search history.

(56) References Cited

U.S. PATENT DOCUMENTS

| 2,243,240 A * | 5/1941 | Zerbe | ........................ B01J 3/048 |
| | | | 196/133 |
| 2,668,158 A * | 2/1954 | Sturm | .................. C09D 161/14 |
| | | | 148/248 |

(Continued)

FOREIGN PATENT DOCUMENTS

| GB | 191208617 A | * | 2/1913 | ................ F17C 1/00 |
| JP | H0666400 | | 3/1994 | |

(Continued)

*Primary Examiner* — Robert J Hicks
(74) *Attorney, Agent, or Firm* — F. Chau & Associates, LLC (57) ABSTRACT

A method of manufacturing a semiconductor device includes disposing a gas-storage cylinder storing monochlorosilane within a gas supply unit. The monochlorosilane is supplied from the gas-storage cylinder into a process chamber to form a silicon containing layer therein. The gas-storage cylinder includes manganese.

13 Claims, 10 Drawing Sheets

(56) References Cited

U.S. PATENT DOCUMENTS

| | | | |
|---|---|---|---|
| 2,679,454 A * | 5/1954 | Offenhauer | C22C 38/42 |
| | | | 420/90 |
| 3,101,862 A * | 8/1963 | Matsch | F17C 3/08 |
| | | | 220/560.13 |
| 3,604,587 A * | 9/1971 | Pechacek | B21D 51/24 |
| | | | 220/587 |
| 7,595,246 B2 | 9/2009 | Kang et al. | |
| 8,590,705 B2 * | 11/2013 | Behm | C23C 16/448 |
| | | | 206/524.3 |
| 9,761,719 B2 | 9/2017 | Kim et al. | |
| 2002/0096049 A1 * | 7/2002 | Funke | B01D 53/02 |
| | | | 95/117 |
| 2009/0166625 A1 | 7/2009 | Ting et al. | |
| 2010/0032934 A1 * | 2/2010 | Veenstra | B60K 15/013 |
| | | | 280/834 |
| 2012/0103857 A1 * | 5/2012 | Behm | C23C 16/448 |
| | | | 206/524.3 |

FOREIGN PATENT DOCUMENTS

| | | |
|---|---|---|
| JP | 4371747 | 11/2009 |
| KR | 20030044396 | 6/2003 |

\* cited by examiner

GAS STORAGE CYLINDER, DEPOSITION SYSTEM, AND METHOD OF MANUFACTURING SEMICONDUCTOR DEVICE

CROSS-REFERENCE TO RELATED APPLICATION

This U.S. non-provisional patent application claims priority under 35 U.S.C. § 119 to Korean Patent Application No. 10-2018-0040089, filed on Apr. 6, 2018, in the Korean Intellectual Property Office, the disclosure of which is hereby incorporated by reference in its entirety.

TECHNICAL FIELD

The present disclosure relates to a gas storage cylinder, and more particularly, to a gas storage cylinder, a deposition system using the same, and a method of manufacturing a semiconductor device.

DISCUSSION OF THE RELATED ART

In the fabricating of a semiconductor device, a deposition process may be used to form a material layer on a substrate. There are various different deposition processes that may be used and these deposition process may generally be classified as either a physical vapor deposition (PVD) processes or chemical vapor deposition (CVD) processes.

Deposition processes such as these may be used to broadly apply a material layer onto a substrate and the material layer may then be patterned and etched into a desired form or deposition processes may be used to selectively apply the material layer, without the need to perform etching.

SUMMARY

A method of manufacturing a semiconductor device includes disposing a gas-storage cylinder storing monochlorosilane within a gas supply unit. The monochlorosilane is supplied from the gas-storage cylinder into a process chamber to form a silicon containing layer therein. The gas-storage cylinder includes manganese.

A deposition system includes a process chamber and a gas supply unit disposed outside of the process chamber. The gas supply unit is configured to supply monochlorosilane into the process chamber. The gas supply unit includes a cabinet configured to receive a gas-storage cylinder. The gas-storage cylinder includes manganese, and the gas-storage cylinder contains the monochlorosilane therein.

A gas-storage cylinder includes a cylinder including manganese. A passivation portion is disposed within and contacting an inner surface of the cylinder. Monochlorosilane is stored within the cylinder and the monochlorosilane makes contact with the passivation portion.

BRIEF DESCRIPTION OF THE DRAWINGS

A more complete appreciation of the present disclosure and many of the attendant aspects thereof will be readily obtained as the same becomes better understood by reference to the accompanying detailed description when considered in connection with the accompanying drawings, wherein.

DETAILED DESCRIPTION OF THE EMBODIMENTS

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

The same reference numerals may denote the same or similar elements throughout the specification and drawings.

A gas-storage cylinder and a deposition system including the gas-storage cylinder according to exemplary embodiments of the present inventive concepts will be described hereinafter.

Figure 1:
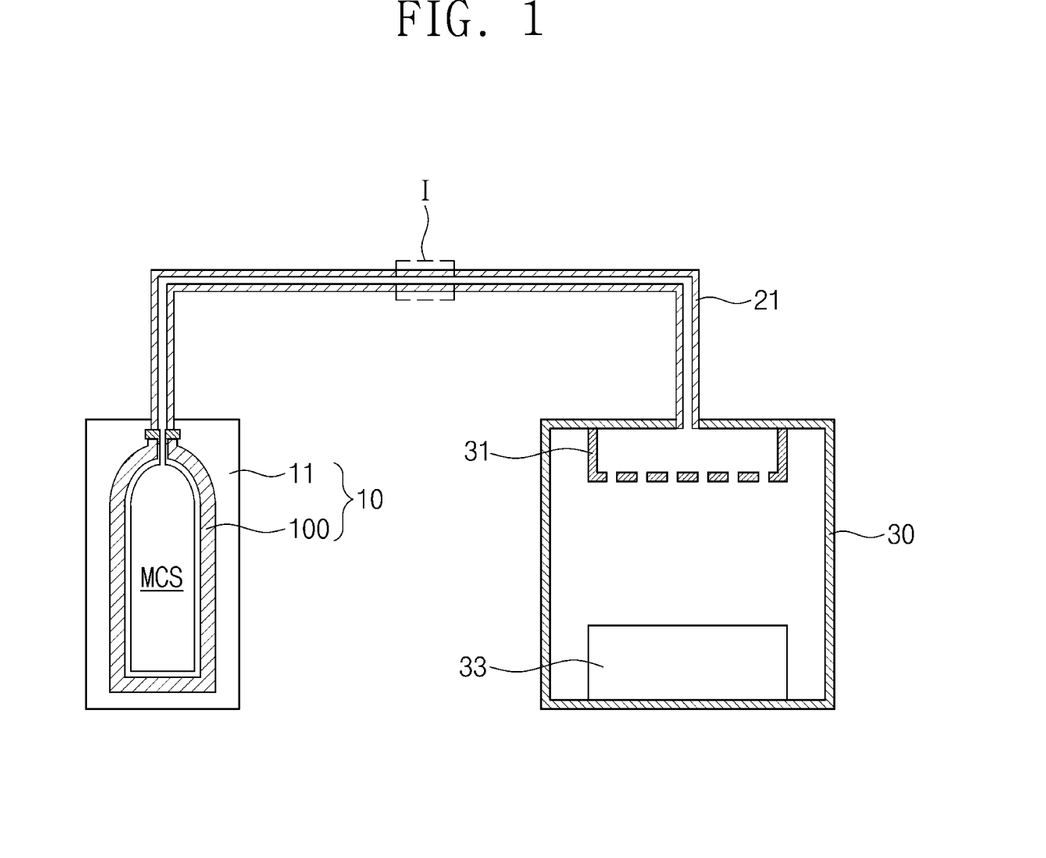
FIG. 1 is a schematic view illustrating a deposition system according to exemplary embodiments of the present inventive concepts.

FIG. 1 is a schematic view illustrating a deposition system according to exemplary embodiments of the present inventive concepts.

Referring to FIG. 1, a deposition system may include a process chamber 30, a first gas supply unit 10, and a first gas supply pipe 21. The process chamber 30 may have an interior space in which a deposition process is performed. A shower head 31 and a chuck 33 may be disposed within the process chamber 30.

The first gas supply unit 10 may be provided outside of the process chamber 30. The first gas supply unit 10 may supply a first source gas into the interior space of the process chamber 30. The first source gas may be used in a process of forming a silicon containing layer. The first source gas may be a silicon containing gas. The silicon containing gas may be monochlorosilane ($SiH_3Cl$; MCS). Hereinafter, the case in which the first source gas is monochlorosilane (MCS) will be described as an example. However, the present invention is not limited to using MCS and other gases may be used as the first source gas.

The first gas supply unit 10 may include a cabinet 11. A gas-storage cylinder 100 in which monochlorosilane (MCS) is stored may be disposed in the cabinet 11. The gas-storage cylinder may be made of a material capable of storing gas without permeation, such as metal, glass, or plastic. The gas-storage cylinder 100 may be installed within the cabinet 11 and the monochlorosilane (MCS) is stored within the gas-storage cylinder 100. When the monochlorosilane (MCS) in the gas-storage cylinder 100 is consumed, the gas-storage cylinder 100 may be replaced.

When a deposition process is performed using monochlorosilane (MCS), efficiency of the deposition process may be increased. For example, the deposition process using monochlorosilane (MCS) may show a high deposition rate and a high yield. However, monochlorosilane (MCS) may be relatively unstable. Monochlorosilane (MCS) may decompose at room temperature to form a byproduct (e.g., $SiH_4$). Monochlorosilane (MCS), the gas-storage cylinder 100 storing monochlorosilane (MCS) and a method of storing the gas-storage cylinder 100 will be described hereinafter in detail.

Figure 2A:
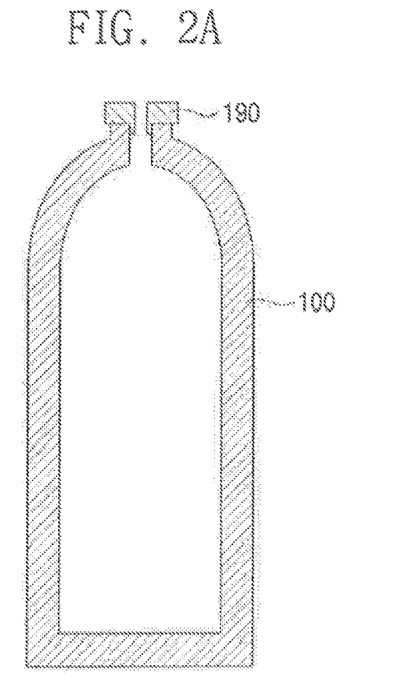
FIGS. 2A to 2C are cross-sectional views illustrating a method of storing a gas using a gas-storage cylinder according to exemplary embodiments of the present inventive concepts.
Figure 2B:
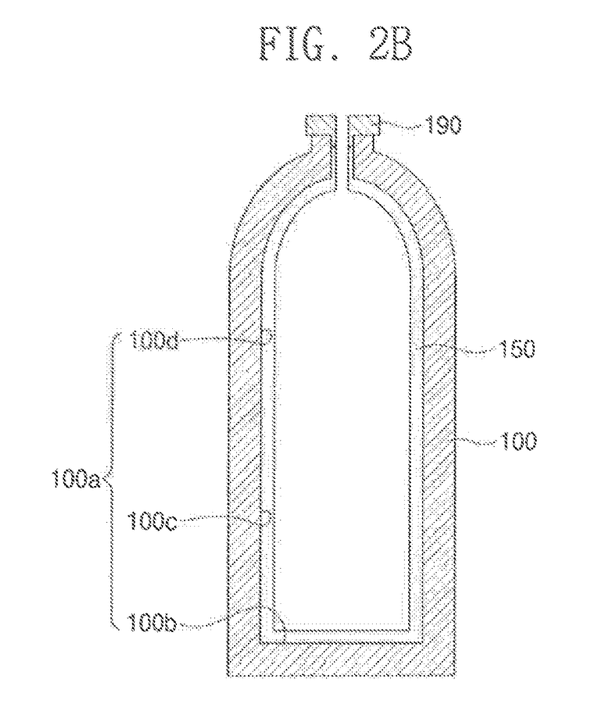
Figure 2C:
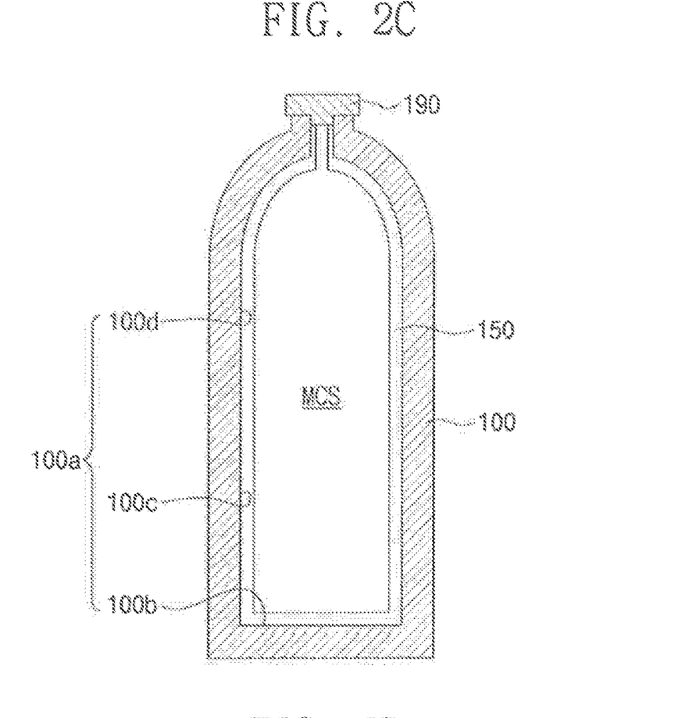

FIGS. 2A to 2C are cross-sectional views illustrating a method of storing a gas within a gas-storage cylinder according to exemplary embodiments of the present inventive concepts.

Referring to FIG. 2A, the gas-storage cylinder 100 may be prepared. The gas-storage cylinder 100 may have an interior space in which monochlorosilane (MCS) is stored. The gas-storage cylinder 100 may include manganese. For example, the gas-storage cylinder 100 may be formed of a material including manganese. A manganese content of the gas-storage cylinder 100 may range from about 1 wt % to about 26 wt %. The gas-storage cylinder 100 may include pure manganese and/or a manganese alloy. As used herein, when it is said that the gas-storage cylinder 100 includes manganese or some other substance, this means that the hull of the gas-storage cylinder 100 includes manganese or the other substance, and this statement does not speak to the contents of the interior of the gas-storage cylinder 100. In contrast, when it is said that the gas-storage cylinder 100 "stores" or "contains" monochlorosilane, this means that the contents of the interior of the gas-storage cylinder 100 is at least partially filled with monochlorosilane, and this statement does not speak to the composition of the hull of the gas-storage cylinder 100. For example, the gas-storage cylinder 100 may include manganese steel. According to exemplary embodiments of the present inventive concepts, the gas-storage cylinder 100 may further include iron, carbon, silicon, phosphorus, sulfur, chromium, and/or any alloy thereof. For example, the gas-storage cylinder 100 may include manganese of about 1 wt % to about 26 wt %, iron of about 62 wt % to about 98.999 wt %, carbon of 0 wt % to about 2 wt %, silicon of about 0.001 wt % to about 2 wt %, phosphorus of 0 wt % to about 1 wt %, sulfur of 0 wt % to about 1 wt %, and chromium of 0 wt % to about 6 wt %. As used herein, when it is said that a component includes a material of 0 wt %, this may mean that the component does not include the material. A valve 190 may be provided at an entrance of the gas-storage cylinder 100. The valve 190 may isolate the interior space of the gas-storage cylinder 100 from the outside.

Referring to FIG. 2B, a passivation portion 150 may be formed on an inner surface 100a of the gas-storage cylinder 100 and may cover the inner surface 100a of the gas-storage cylinder 100. For example, the passivation portion 150 may cover a lower portion and an upper portion of the inner surface 100a of the gas-storage cylinder 100. The lower portion of the inner surface 100a of the gas-storage cylinder 100 may include a bottom surface 100b and a lower portion 100c of an inner sidewall of the gas-storage cylinder 100. The upper portion of the inner surface 100a of the gas-storage cylinder 100 may include an upper portion 100d of the inner sidewall of the gas-storage cylinder 100. The upper portion of the inner surface 100a of the gas-storage cylinder 100 may be closer to the valve 190 than the bottom surface 100b of the gas-storage cylinder 100. The passivation portion 150 may be adsorbed into the inner surface 100a of the gas-storage cylinder 100 either by physical adsorption, chemical adsorption, or adsorption by some other means. However, the present invention not limited to this particular configuration. The same material (e.g., monochlorosilane) as the gas described above may be stored and may be applied onto the inner surface 100a of the gas-storage cylinder 100 to form the passivation portion 150. For example, the passivation portion 150 may include monochlorosilane and/or derivatives thereof. The passivation portion 150 may be in a liquid state.

Referring to FIG. 2C, the interior space of the gas-storage cylinder 100 may be filled with monochlorosilane (MCS). Monochlorosilane (MCS) may be provided on the passivation portion 150. Monochlorosilane (MCS) may be provided into the gas-storage cylinder 100 in a gas state. Monochlorosilane (MCS) may be stored in a liquefied gas state in the gas-storage cylinder 100.

If the manganese content of the gas-storage cylinder 100 is less than about 1 wt %, monochlorosilane (MCS) may decompose in the gas-storage cylinder 100. However, according to exemplary embodiments of the present disclosure, since the manganese content of the gas-storage cylinder 100 is about 1 wt % or more, the decomposition reaction of monochlorosilane (MCS) may be inhibited or prevented. The decomposition reaction of monochlorosilane (MCS) may occur at a contact surface of the gas-storage cylinder 100 and monochlorosilane (MCS), for example, at the inner surface 100a of the gas-storage cylinder 100. However, according to exemplary embodiments of the present disclosure, the passivation portion 150 may be provided between monochlorosilane (MCS) and the gas-storage cylinder 100. Thus, the decomposition reaction of monochlorosilane (MCS) may be inhibited or prevented by the passivation portion 150. According to exemplary embodiments of the present disclosure, the passivation portion 150 may cover both the lower portion and the upper portion of the inner surface 100a of the gas-storage cylinder 100, and thus the decomposition reaction of monochlorosilane (MCS) may be further inhibited or prevented. As a result, even though monochlorosilane (MCS) is stored in the gas-storage cylinder 100 for a long time, a high purity of monochlorosilane (MCS) may be maintained. For example, the purity of monochlorosilane (MCS) may range from about 99.90 vol % to 100 vol %. Thereafter, the valve 190 may be closed to complete storage of the monochlorosilane (MCS) gas. A gas storage cylinder, according to exemplary embodiments of the inventive concepts, may include the gas-storage cylinder 100, the passivation portion 150, and the stored monochlorosilane (MCS).

Figure 2D:
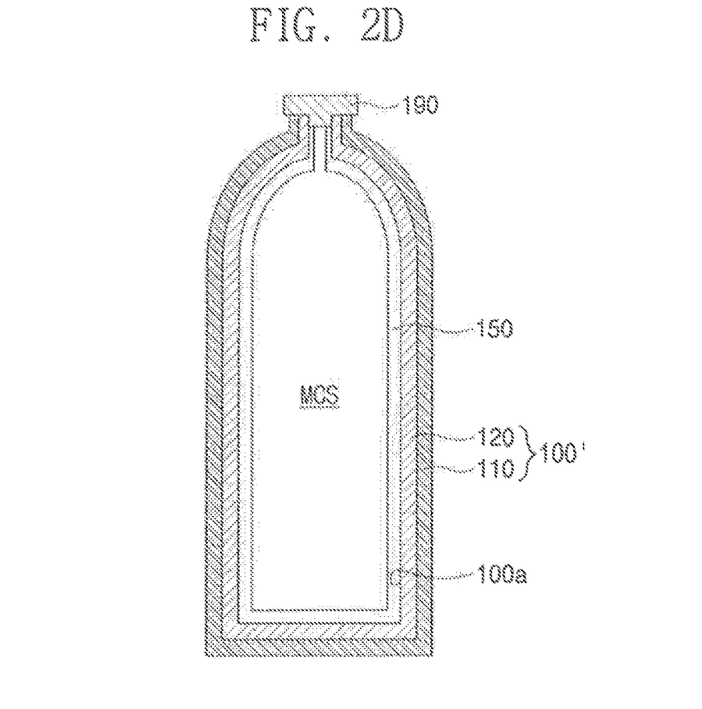
FIG. 2D is a cross-sectional view illustrating a gas-storage cylinder according to exemplary embodiments of the present inventive concepts.

FIG. 2D is a cross-sectional view illustrating a gas-storage cylinder according to exemplary embodiments of the present inventive concepts. To the extent that a detailed description of certain element is omitted, it may be assumed that these elements are at least similar to corresponding elements that have already been described.

Referring to FIG. 2D, monochlorosilane (MCS) may be stored in a gas-storage cylinder 100'. The gas-storage cylinder 100' may include an outer cylinder 110 and an inner cylinder 120. The inner cylinder 120 may cover an inner surface of the outer cylinder 110. The inner cylinder 120 may be formed by coating the inner surface of the outer cylinder 110 with a metal material. The inner cylinder 120 may include manganese. A manganese content of the inner cylinder 120 may range from about 1 wt % to 100 wt %. Since the inner cylinder 120 includes manganese of about 1 wt % or more, decomposition reaction of monochlorosilane (MCS) may be reduced or prevented. In an embodiment, the inner cylinder 120 may further include iron, carbon, silicon, phosphorus, sulfur, and/or chromium. The outer cylinder 110 may include, for example, carbon steel, chromium-cobalt steel, and/or stainless steel. For example, the outer cylinder 110 may include aluminum, nickel, cobalt, brass, copper, and/or any alloy thereof. The manganese content of the inner cylinder 120 may be higher than that of the outer cylinder 110. When the manganese content of the inner cylinder 120 is higher than that of the outer cylinder 110, the inner cylinder 120 may include manganese but the outer cylinder 110 might not include manganese.

A passivation portion 150 may be provided on an inner surface 100a of the gas-storage cylinder 100'. Here, the inner surface 100a of the gas-storage cylinder 100' may correspond to an inner surface of the inner cylinder 120. The passivation portion 150 may be substantially the same as described above with reference to FIGS. 2B and 2C. For example, the passivation portion 150 may include monochlorosilane and/or derivatives thereof. Monochlorosilane (MCS) may be provided on the passivation portion 150. The purity of monochlorosilane (MCS) may range from about 99.90 vol % to 100 vol % while monochlorosilane (MCS) is stored in the gas-storage cylinder 100'.

Figure 2E:
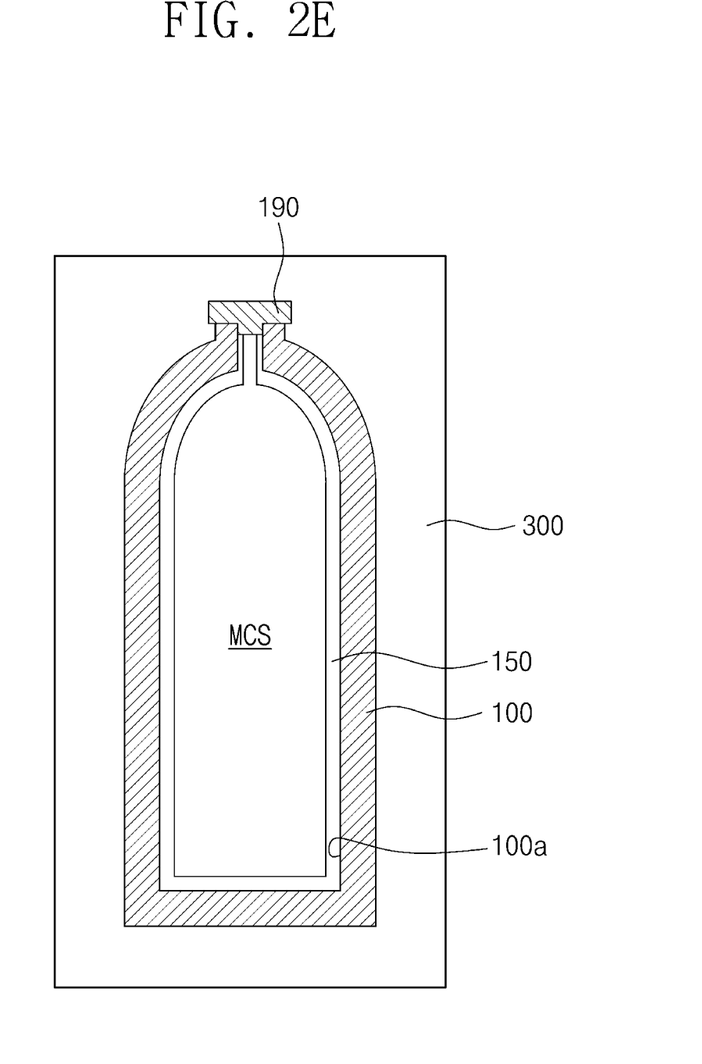
FIG. 2E is a schematic view illustrating a method of storing a gas-storage cylinder according to exemplary embodiments of the present inventive concepts.

FIG. 2E is a schematic view illustrating a method of storing a gas-storage cylinder according to exemplary embodiments of the inventive concepts. To the extent that a detailed description of certain element is omitted, it may be assumed that these elements are at least similar to corresponding elements that have already been described.

Referring to FIG. 2E, the gas-storage cylinder 100 may be kept in a storage housing 300. Here, the gas-storage cylinder 100 in which monochlorosilane (MCS) is stored by the method described with reference to FIGS. 2A to 2C may be provided in the storage housing 300. Alternatively, the gas-storage cylinder 100' of FIG. 2D, in which monochlorosilane (MCS) is stored, may be provided in the storage housing 300.

The storage housing 300 may be a housing of a storage warehouse or a housing of a transfer means. If the gas-storage cylinder 100 is kept at a temperature higher than about 10 degrees Celsius, the decomposition reaction of monochlorosilane (MCS) may occur. Thus, an inner temperature of the storage housing 300 may be set to, and maintained at, a temperature of about −45 degrees Celsius to about 10 degrees Celsius. The decomposition reaction of monochlorosilane (MCS) in the gas-storage cylinder 100 may be reduced or prevented under the aforementioned temperature range, and thus monochlorosilane (MCS) may be stored in the gas-storage cylinder 100 at a high purity. The storage housing 300 may include a temperature control device disposed therein. The temperature control device may establish and maintain the inner temperature of the storage housing 300. According to exemplary embodiments of the present disclosure, a temperature control device may be disposed outside of the storage housing 300. Monochlorosilane (MCS) may be kept and transferred at the purity of about 99.90 vol % to 100 vol % by the storage housing 300 and the gas-storage cylinder 100.

Referring again to FIG. 1, the gas-storage cylinder 100 may be installed within the cabinet 11 of the first gas supply unit 10. The gas-storage cylinder 100 may be kept in the storage housing 300 described with reference to FIG. 2E and then may be moved from the storage housing 300 into the cabinet 11. The cabinet 11 may surround the gas-storage cylinder 100. The cabinet 11 may include a temperature control device. The temperature control device may be integrally formed with the cabinet 11 as a single unitary body. A cooling device, such as a chiller, may be used as the temperature control device. The temperature control device may set and/or maintain an inner temperature of the cabinet 11 to a temperature of about −45 degrees Celsius to about 10 degrees Celsius. During formation of a silicon containing layer to be described later, the gas-storage cylinder 100 may be maintained within a temperature range of about −45 degrees Celsius to about 10 degrees Celsius. Thus, monochlorosilane (MCS) of a high purity (e.g., a purity of about 99.90 vol % to 100 vol %) may be supplied to the process chamber 30.

The first gas supply pipe 21 may be provided between the first gas supply unit 10 and the process chamber 30. An interior space of the first gas supply pipe 21 may be connected to the interior space of the gas-storage cylinder 100 and the interior space of the process chamber 30. Monochlorosilane (MCS) in the gas-storage cylinder 100 may be supplied to the process chamber 30 through the first gas supply pipe 21. Hereinafter, the first gas supply pipe 21 will be described in more detail.

Figure 3A:
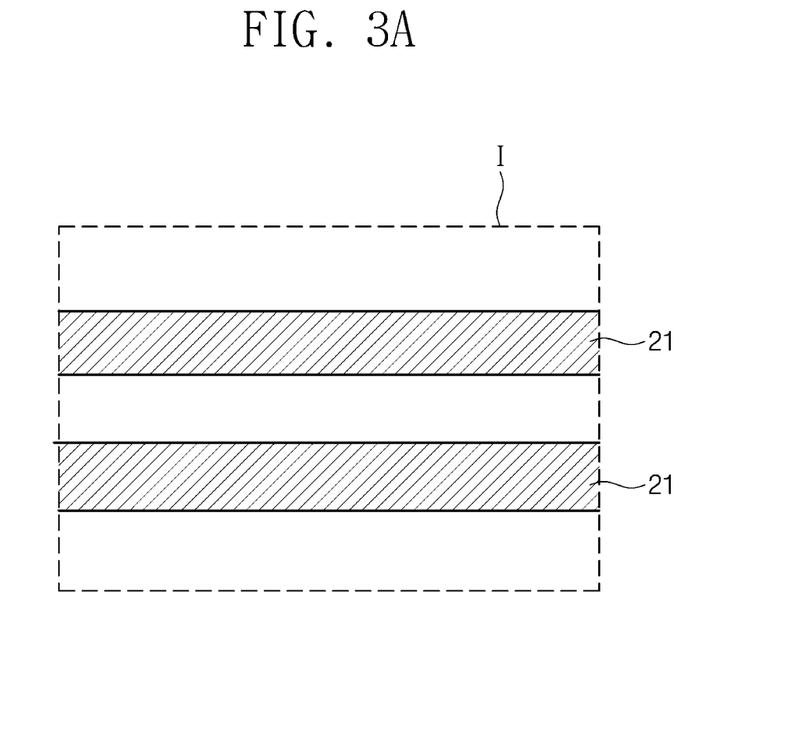
FIG. 3A is a schematic view illustrating a first gas supply pipe according to exemplary embodiments of the present inventive concepts.
Figure 3B:
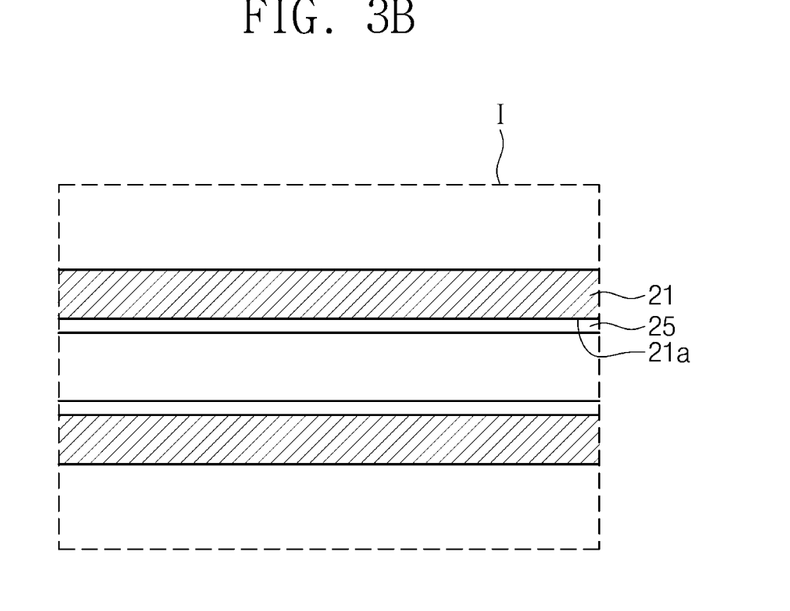
FIG. 3B is a schematic view illustrating a first gas supply pipe according to exemplary embodiments of the present inventive concepts.
Figure 3C:
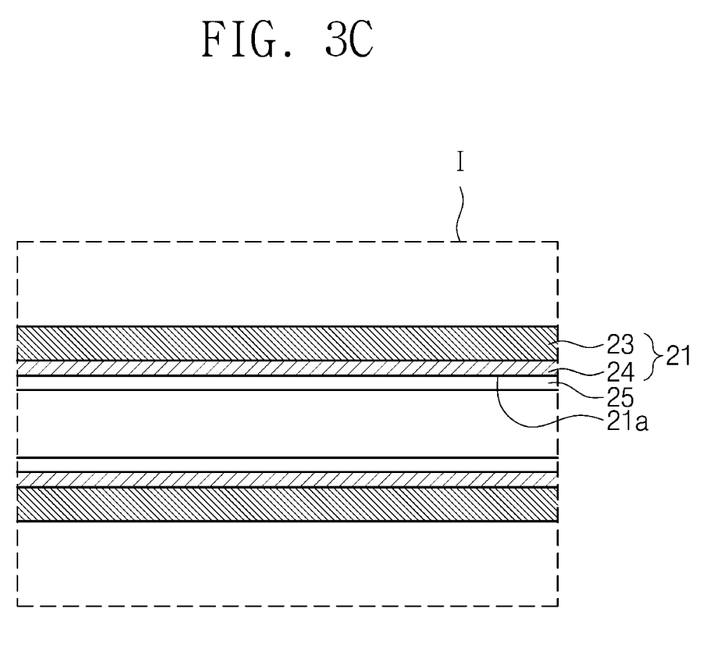
FIG. 3C is a schematic view illustrating a first gas supply pipe according to exemplary embodiments of the present inventive concepts.

FIGS. 3A to 3C are enlarged views of a region 'I' of FIG. 1 illustrating first gas supply pipes according to exemplary embodiments of the present inventive concepts. To the extent that a detailed description of certain element is omitted, it may be assumed that these elements are at least similar to corresponding elements that have already been described.

Referring to FIGS. 3A, 3B and 3C, the first gas supply pipe 21 may have the interior space. The interior space of the first gas supply pipe 21 may be used as a path through which a first source gas (e.g., monochlorosilane (MCS)) moves.

Referring to FIGS. 3A and 3B, the first gas supply pipe 21 may include manganese. For example, the first gas supply pipe 21 may include manganese steel. The first gas supply pipe 21 may include manganese of about 1 wt % to about 26 wt %, iron of about 62 wt % to about 98.999 wt %, carbon of 0 wt % to about 2 wt %, silicon of about 0.001 wt % to about 2 wt %, phosphorus of 0 wt % to about 1 wt %, sulfur of 0 wt % to about 1 wt %, and chromium of 0 wt % to about 6 wt %. If the manganese content of the first gas supply pipe 21 is less than about 1 wt %, monochlorosilane (MCS) may decompose within the first gas supply pipe 21. However, according to exemplary embodiments of the present disclosure, the manganese content of the first gas supply pipe 21 may range from about 1 wt % to about 26 wt %. Thus, it is possible to inhibit or prevent monochlorosilane (MCS) from being decomposed in the first gas supply pipe 21.

As illustrated in FIG. 3B, a path passivation portion 25 may be formed on an inner surface 21a of the first gas supply pipe 21. The path passivation portion 25 may be adsorbed on the inner surface 21a of the first gas supply pipe 21. For example, the path passivation portion 25 may include monochlorosilane and/or derivatives thereof. The path passivation portion 25 may be in a liquid state. Thus, monochlorosilane (MCS) of a high purity (e.g., the purity of about 99.90 vol % to 100 vol %) may be supplied to the process chamber 30.

As illustrated in FIG. 3C, a first gas supply pipe 21 may include an inner pipe 24 and an outer pipe 23. The inner pipe 24 may be formed by coating an inner surface of the outer pipe 23 with a metal material. The inner pipe 24 may include manganese. A manganese content of the inner pipe 24 may be higher than a manganese content of the outer pipe 23. For example, the manganese content of the inner pipe 24 may range from about 1 wt % to 100 wt %. The inner pipe 24 may further include iron, carbon, silicon, phosphorus, sulfur, and/or chromium. Since the inner pipe 24 includes manganese of about 1 wt % or more, it is possible to inhibit or prevent monochlorosilane (MCS) from being decomposed in the first gas supply pipe 21. The outer pipe 23 may include, for example, carbon steel, chromium-cobalt steel, and/or stainless steel. For example, the outer pipe 23 may include aluminum, nickel, cobalt, brass, copper, and/or any alloy thereof.

A path passivation portion 25 may cover an inner surface 21a of the first gas supply pipe 21. The inner surface 21a of the first gas supply pipe 21 may correspond to an inner surface of the inner pipe 24. According to exemplary embodiments of the present disclosure, the path passivation portion 25 may be omitted.

Figure 4A:
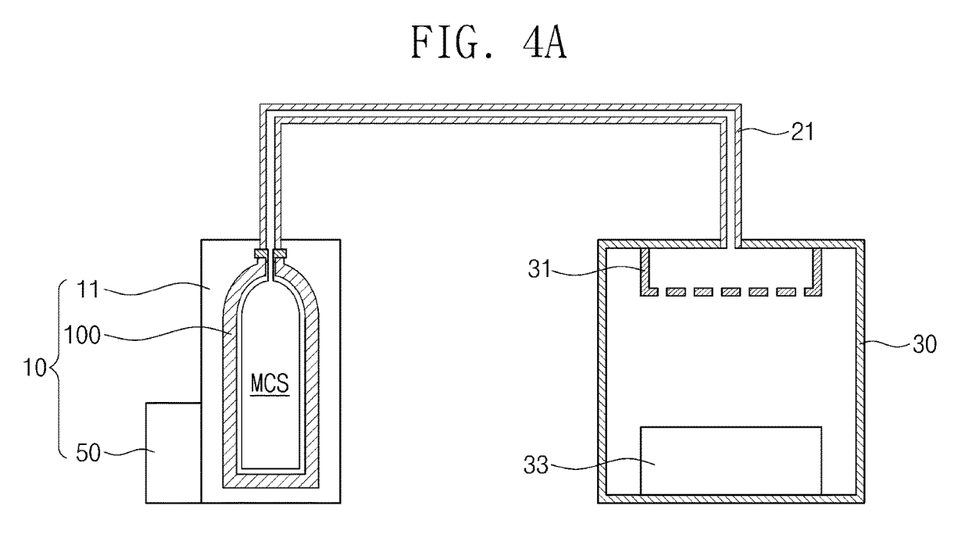
FIG. 4A is a schematic view illustrating a deposition system according to exemplary embodiments of the present inventive concepts.

FIG. 4A is a schematic view illustrating a deposition system according to exemplary embodiments of the present inventive concepts. To the extent that a detailed description of certain element is omitted, it may be assumed that these elements are at least similar to corresponding elements that have already been described.

Referring to FIG. 4A, a deposition system may include a process chamber 30, a first gas supply unit 10, and a first gas supply pipe 21. The process chamber 30 and the first gas supply pipe 21 may be substantially the same as described above with reference to FIGS. 1 to 3C.

The first gas supply unit 10 may include a cabinet 11 and a temperature control device 50. Unlike the configuration described above with respect to FIG. 1, the temperature control device 50 may be additionally provided outside of the cabinet 11. The temperature control device 50 may maintain an inner temperature of the cabinet 11 to a temperature of about −45 degrees Celsius to about 10 degrees Celsius. The temperature control device 50 may include a cooling device such as a chiller. The arrangement and a size of the temperature control device 50 may be variously modified.

Figure 4B:
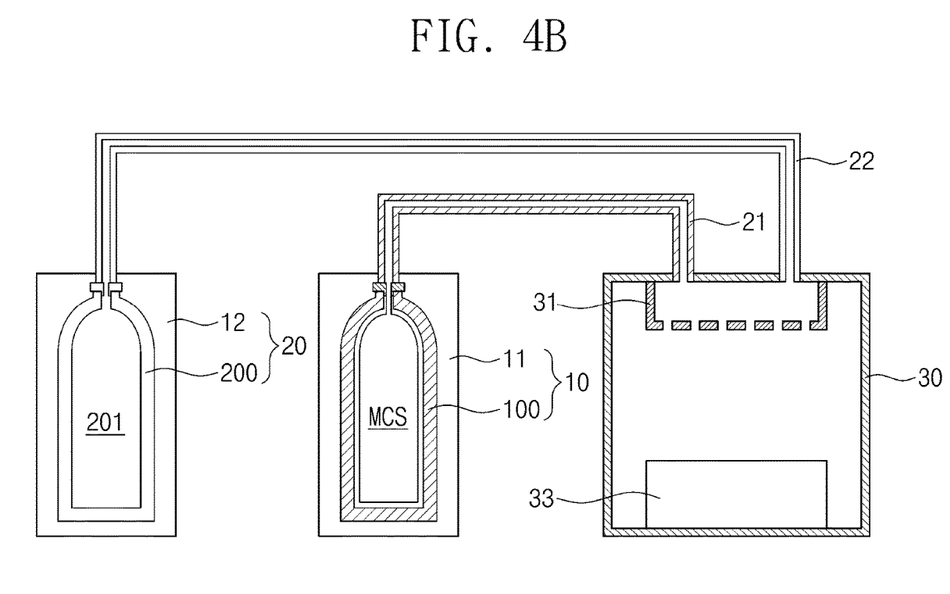
FIG. 4B is a schematic view illustrating a deposition system according to exemplary embodiments of the present inventive concepts.

FIG. 4B is a schematic view illustrating a deposition system according to exemplary embodiments of the present inventive concepts. To the extent that a detailed description of certain element is omitted, it may be assumed that these elements are at least similar to corresponding elements that have already been described.

Referring to FIG. 4B, a deposition system may include a process chamber 30, a first gas supply unit 10, a first gas supply pipe 21, a second gas supply unit 20, and a second gas supply pipe 22. The process chamber 30, the first gas supply unit 10, and the first gas supply pipe 21 may be substantially the same as described above with reference to FIGS. 1 to 3C. For example, the cabinet 11 and the temperature control device may be integrally formed with each other as a single unitary body. For example, the temperature control device 50 of FIG. 4A may be provided outside of the cabinet 11 to maintain the inner temperature of the cabinet 11.

The second gas supply unit 20 may be provided outside of the process chamber 30. The second gas supply unit 20 may include a cabinet part 12. The cabinet part 12 may be configured to receive a storage cylinder 200 storing a second source gas 201 therein. The storage cylinder 200 in which the second source gas 201 is stored may be installed in the cabinet part 12. When the second source gas 201 in the storage cylinder 200 is consumed, the storage cylinder 200 may be replaced. The second gas supply unit 20 may supply the second source gas 201 into the process chamber 30 through the second gas supply pipe 22. The second source gas 201 may be different from the first source gas (e.g., monochlorosilane (MCS)). For example, the second source gas 201 may include a germanium containing gas, a nitrogen containing gas, or an oxygen containing gas. The second gas supply pipe 22 may be provided between the second gas supply unit 20 and the process chamber 30 and may connect the second gas supply unit 20 to the process chamber 30.

According to exemplary embodiments of the present disclosure, a third gas supply unit may further be provided outside of the process chamber 30. The third gas supply unit may supply a third source gas into the process chamber 30, and the third source gas may be different from the second source gas 201 and the first source gas.

Hereinafter, a method of forming a silicon containing layer according to exemplary embodiments of the present inventive concepts will be described, and a method of manufacturing a semiconductor device including the silicon containing layer will be described.

Figure 5:
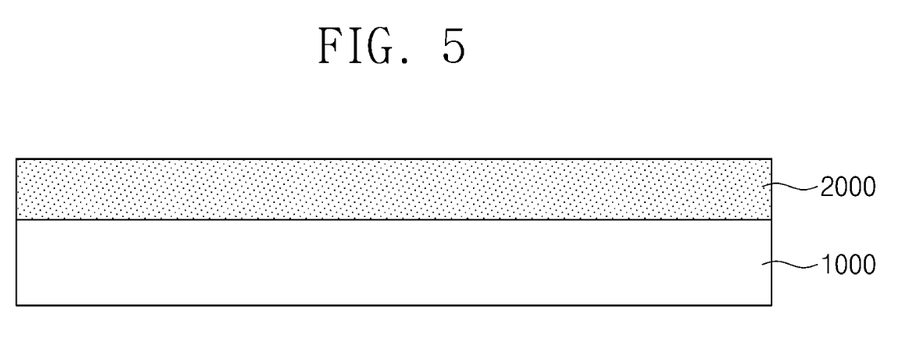
FIG. 5 is a cross-sectional view illustrating a process of forming a silicon containing layer, according to exemplary embodiments of the present inventive concepts.

FIG. 5 is a cross-sectional view illustrating a process of forming a silicon containing layer, according to exemplary embodiments of the present inventive concepts. To the extent that a detailed description of certain element is omitted, it may be assumed that these elements are at least similar to corresponding elements that have already been described.

Referring to FIGS. 1 and 5, a silicon containing layer 2000 may be formed on a substrate 1000 by using a deposition system described above. According to exemplary embodiments of the present disclosure, the substrate 1000 may be loaded on a top surface of the chuck 33 of FIG. 1. The substrate 1000 may be loaded on the chuck 33 of the deposition system of FIG. 4A or 4B. The substrate 1000 may be a semiconductor wafer. Monochlorosilane (MCS) supplied from the first gas supply pipe 21 may be provided into the process chamber 30 through the shower head 31.

The silicon containing layer 2000 may be formed on the substrate 1000 by using the monochlorosilane (MCS), as illustrated in FIG. 5. The silicon containing layer 2000 may be formed by a deposition process. The deposition process may include an epitaxial growth process, a chemical vapor deposition (CVD) process, or an atomic layer deposition (ALD) process. The epitaxial growth process may include a selective epitaxial growth (SEG) process. The CVD process may include a plasma-enhanced CVD process.

According to exemplary embodiments of the present disclosure, the silicon containing layer 2000 may be used as one of a source/drain pattern, a gate insulating layer, a spacer of a contact plug, and a liner layer in a semiconductor device. According to exemplary embodiments of the present disclosure, the silicon containing layer 2000 may function as a gap-fill layer filling a gap between components in a semiconductor device. According to exemplary embodiments of the present disclosure, the silicon containing layer 2000 may be used as a mask pattern in a process of manufacturing a semiconductor device.

According to exemplary embodiments of the present disclosure, the silicon containing layer 2000 may include silicon-germanium, silicon oxide, and/or silicon nitride. In these cases, the deposition system of FIG. 4B may be used. The silicon containing layer 2000 may be formed by a deposition process using monochlorosilane (MCS) and the second source gas 201. The second source gas 201 may be supplied to the process chamber 30 through the second gas supply pipe 22. The composition of the second source gas 201 may be selected depending on a material of the silicon containing layer 2000 to be deposited. For example, the second source gas 201 may include a germanium containing gas, a nitrogen containing gas, and/or an oxygen containing gas. According to exemplary embodiments of the present disclosure, since the silicon containing layer 2000 is formed using monochlorosilane (MCS), the silicon containing layer 2000 may be formed at a high deposition rate.

At least one layer and/or at least one pattern may further be formed between the substrate 1000 and the silicon containing layer 2000. However, the shape of the silicon containing layer 2000 is not limited to the shape illustrated in FIG. 5 but may be variously modified.

Figure 6:
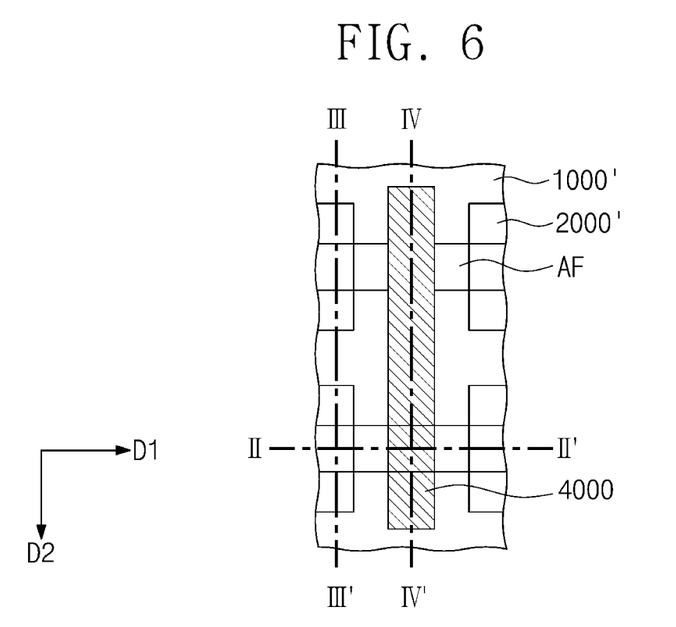
FIG. 6 is a plan view illustrating a semiconductor device according to exemplary embodiments of the present inventive concepts.

FIG. 6 is a plan view illustrating a semiconductor device according to exemplary embodiments of the present inventive concepts. FIGS. 7A to 7D are cross-sectional views taken along lines IMP, III-III' and IV-IV' of FIG. 6 illustrating a method of manufacturing a semiconductor device according to exemplary embodiments of the present inventive concepts. To the extent that a detailed description of certain element is omitted, it may be assumed that these elements are at least similar to corresponding elements that have already been described.

Figure 7A:
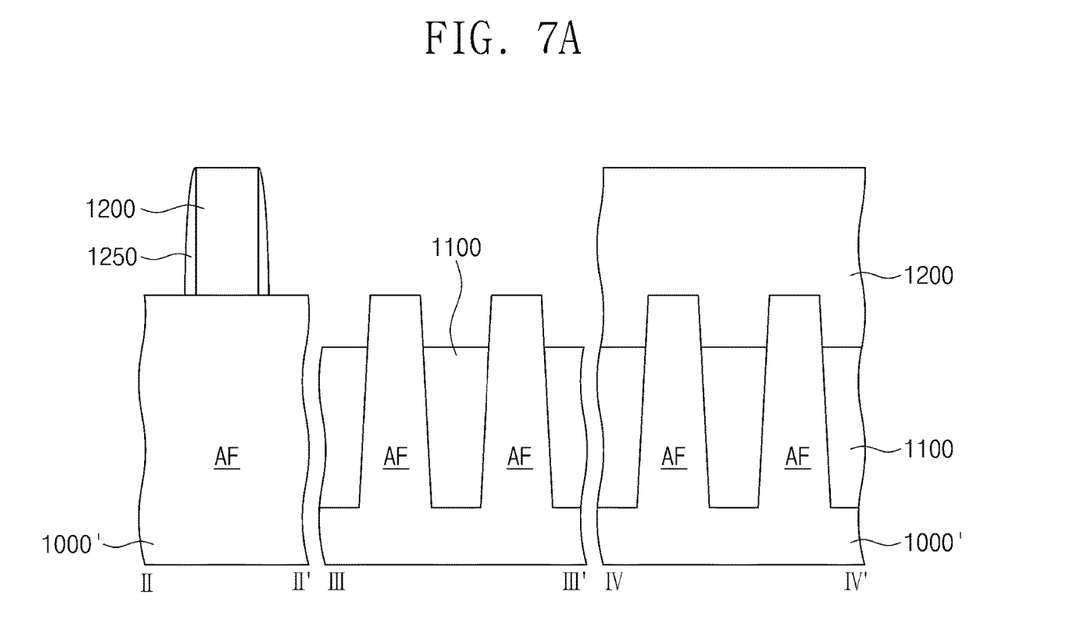
FIGS. 7A to 7D are cross-sectional views illustrating a method of manufacturing a semiconductor device, according to exemplary embodiments of the present inventive concepts.

Referring to FIGS. 6 and 7A, an active pattern AF protruding from a semiconductor substrate 1000' may be formed. The active pattern AF may extend in a first direction D1, as illustrated in FIG. 6. The first direction D1 may be parallel to a bottom surface of the semiconductor substrate 1000'. For example, the semiconductor substrate 1000' may be a silicon substrate, a germanium substrate, a silicon-germanium substrate, and/or an epitaxial substrate. The formation of the active pattern AF may include forming a mask pattern on the semiconductor substrate 1000', and etching the semiconductor substrate 1000' using the mask pattern as an etch mask.

A device isolation pattern 1100 may be formed on the semiconductor substrate 1000' and may cover both sidewalls of a lower portion of the active pattern AF. An upper portion of the active pattern AF may be exposed by the device isolation pattern 1100. The device isolation pattern 1100 may be formed by a shallow-trench isolation (STI) method. The device isolation pattern 1100 may include a high-density plasma oxide layer, a spin-on-glass (SOG) layer, and/or a CVD oxide layer.

A sacrificial gate pattern 1200 may be formed on the semiconductor substrate 1000'. The sacrificial gate pattern 1200 may intersect the active pattern AF and may extend in a second direction D2. The second direction D2 may be parallel to the bottom surface of the semiconductor substrate 1000' and may intersect the first direction D1. The sacrificial gate pattern 1200 may cover a portion of the active pattern AF and may leave other portions of the active pattern AF exposed. The sacrificial gate pattern 1200 may include poly-silicon.

Spacer patterns 1250 may be formed on both sidewalls of the sacrificial gate pattern 1200 on the semiconductor substrate 1000'. For example, a spacer layer may be conformally formed on the semiconductor substrate 1000' and may cover the sacrificial gate pattern 1200. The spacer layer may be etched by an etch-back process to form the spacer patterns 1250. The spacer patterns 1250 may include an insulating material such as silicon nitride, silicon carbide, silicon carbonitride, and/or silicon oxynitride. In certain exemplary embodiments of the present disclosure, the spacer patterns 1250 may include a high-k dielectric material. The high-k dielectric material may include hafnium oxide, hafnium silicate, zirconium oxide, and/or zirconium silicate.

Figure 7B:
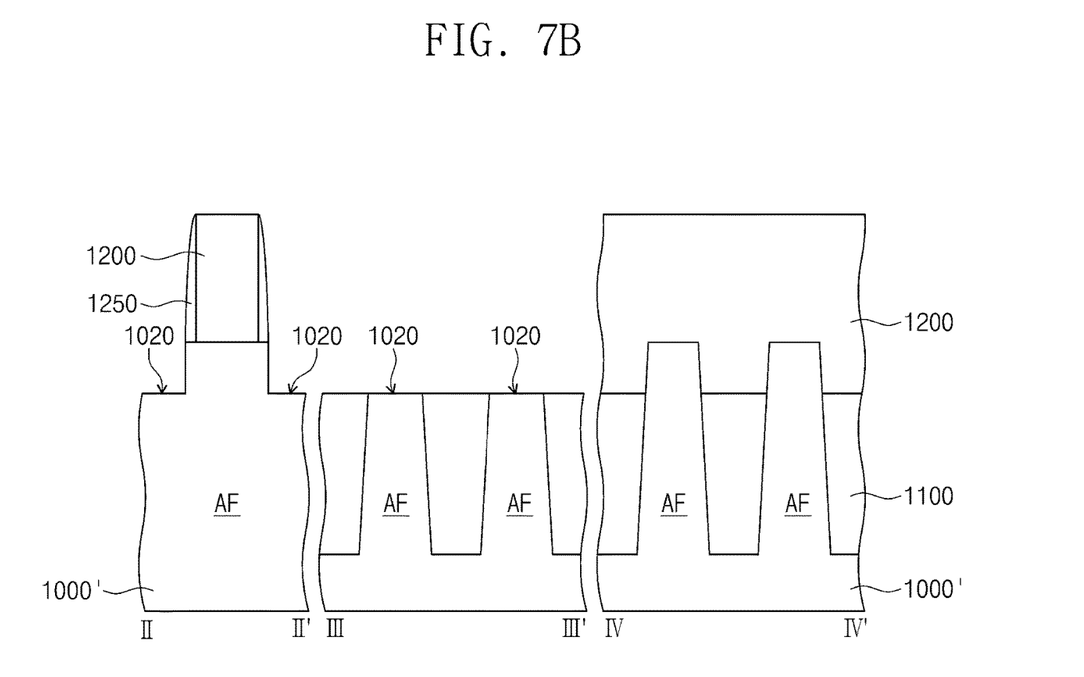

Referring to FIGS. 6 and 7B, the active pattern AF exposed by the sacrificial gate pattern 1200 may be etched to form recess portions 1020 in the active pattern AF. Bottom surfaces of the recess portions 1020 may be disposed at a lower level than that of the topmost surface of the active pattern AF. The recess portions 1020 may be formed at both sides of the sacrificial gate pattern 1200, respectively.

Figure 7C:
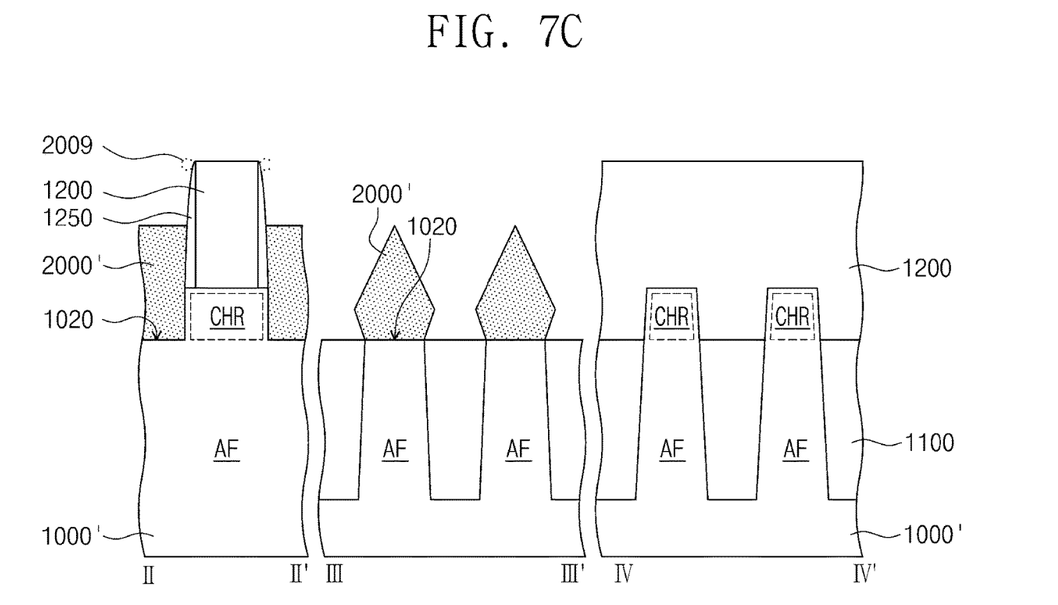

Referring to FIGS. 4B, 6 and 7C, source/drain patterns 2000' may be formed on the active pattern AF at both sides of the sacrificial gate pattern 1200, respectively. The source/drain patterns 2000' may include epitaxial patterns grown from the recess portions 1020 of the active pattern AF. The source/drain patterns 2000' may be formed by the same or similar method as the method of forming the silicon containing layer described above with reference to FIG. 5. For example, the semiconductor substrate 1000' may be provided into the process chamber 30 of FIG. 4B. For example, the semiconductor substrate 1000' may be loaded on the chuck 33 within the process chamber 30. Monochlorosilane (MCS) and the second source gas 201 may be supplied to the process chamber 30. Monochlorosilane (MCS) may be supplied from the first gas supply unit 10. The second source gas 201 may be supplied from the second gas supply unit 20. A germanium containing gas may be used as the second source gas 201. The source/drain patterns 2000' may be formed using monochlorosilane (MCS) and the second source gas 201. The source/drain patterns 2000' may include silicon-germanium (SiGe). By the formation of the source/drain patterns 2000', a channel region CHR may be defined in the active pattern AF under the sacrificial gate pattern 1200. The channel region CHR may be defined in the active pattern AF between the source/drain patterns 2000'.

In the process of forming the source/drain patterns 2000', a byproduct pattern 2009 may be formed when a byproduct gas is excessively supplied. The byproduct gas may be formed by a decomposition reaction of monochlorosilane (MCS). The byproduct gas may include silane ($SiH_4$). The byproduct pattern 2009 may be an epitaxial pattern formed on the spacer pattern 1250, as illustrated by dotted lines in FIG. 7C. The formation of the byproduct pattern 2009 may act as a process loss or a defect in a process of manufacturing a semiconductor device. However, according to exemplary embodiments of the present inventive concepts, since monochlorosilane (MCS) is supplied at a high purity into the process chamber 30, the formation of the byproduct pattern 2009 may be reduced or prevented. Thus, productivity and a yield of the semiconductor device may be increased.

According to exemplary embodiments of the present disclosure, the source/drain patterns 2000' may be rapidly formed by using monochlorosilane (MCS). For example, a formation rate of the source/drain pattern 2000' formed using monochlorosilane (MCS) may be higher than that of a source/drain pattern formed using dichlorosilane. Thus, the productivity of the semiconductor device may be increased.

Selectivity of the process of forming the source/drain pattern 2000' using monochlorosilane (MCS) may be higher than that of a process of forming a source/drain pattern using dichiorosilane. For example, the source/drain pattern 2000' may be selectively formed on the recess portion 1020, and a size and a shape of the source/drain pattern 2000' may be more precisely controlled.

Figure 7D:
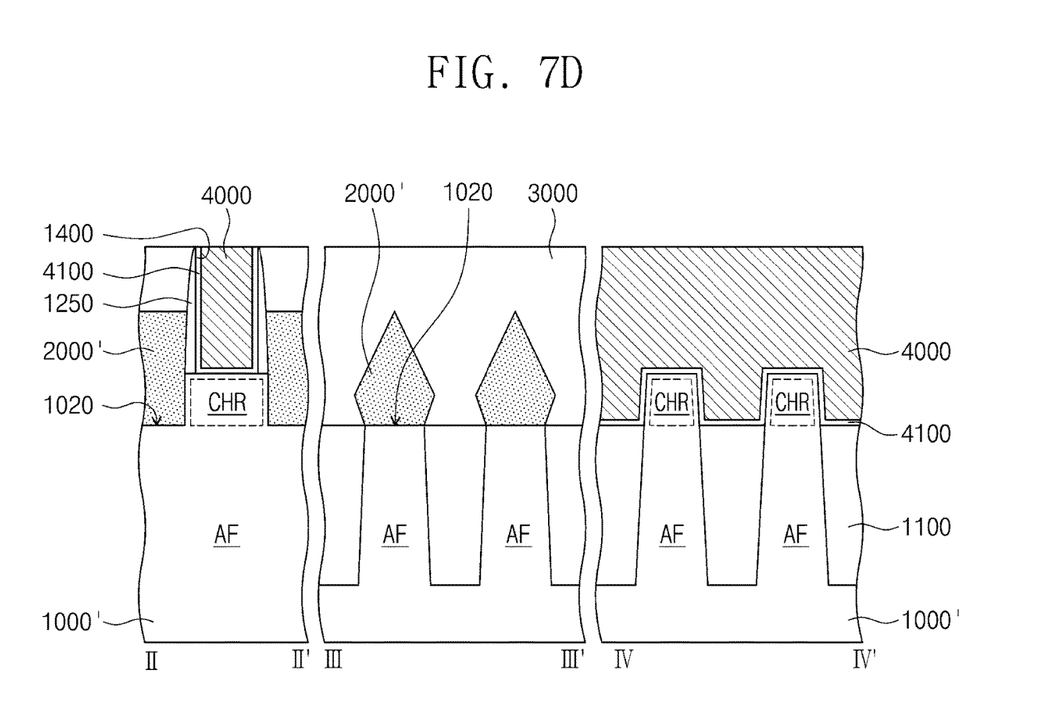

Referring to FIGS. 6 and 7D, an interlayer insulating layer 3000 may cover the source/drain patterns 2000'. For example, the interlayer insulating layer 3000 may include silicon oxide, silicon nitride, silicon oxynitride, and/or a low-k dielectric material. The sacrificial gate pattern 1200 may be removed to form an opening 1400. The opening 1400 may expose the channel region CHR of the active pattern AF between the spacer patterns 1250. A gate insulating pattern 4100 may be formed on a bottom surface and inner sidewalls of the opening 1400 and may cover the channel region CHR of the active pattern AF. For example, the gate insulating pattern 4100 may include silicon oxide, silicon nitride, silicon oxynitride, and/or a high-k dielectric material.

A gate pattern 4000 may be formed on the gate insulating pattern 4100 in the opening 1400. The gate pattern 4000 may extend in the second direction D2 and may intersect the active pattern AF. The gate pattern 4000 may be formed on the channel region CHR of the active pattern AF. The gate pattern 4000 may include a plurality of layers. The gate pattern 4000 may include a conductive material such as a conductive metal nitride, a transition metal (e.g., titanium or tantalum), and/or a metal. As a result, a semiconductor device may be manufactured.

According to exemplary embodiments of the inventive concepts, the gas-storage cylinder may include manganese, and thus the decomposition reaction of monochlorosilane may be reduced or prevented. In addition, the passivation portion may be provided in the gas-storage cylinder, and thus the decomposition reaction of monochlorosilane may be further reduced or prevented. Moreover, the gas-storage cylinder may be kept at a relatively low temperature, such as within the temperature ranges discussed above, and thus monochlorosilane may be stably stored. Thus, monochlorosilane having a high purity may be supplied from the gas-storage cylinder into the process chamber.

The silicon containing layer may be formed using the monochlorosilane, and thus the productivity of the semiconductor device may be increased.

While exemplary embodiments of the present inventive concepts have been described with reference to the figures, it will be apparent to those skilled in the art that various changes and modifications may be made without departing from the spirits and scopes of the inventive concepts.

What is claimed is:

1. A gas-storage cylinder comprising:
a cylinder, wherein a hull of the cylinder includes manganese and iron;
a passivation portion disposed within and contacting an inner surface of the cylinder; and
a valve provided at an entrance of the cylinder; and
monochlorosilane stored within the cylinder and making contact with the passivation portion,
wherein a manganese content of the hull of the cylinder ranges from about 1 wt % to about 26 wt %,
wherein an iron content of the hull of the cylinder ranges from about 62 wt % to about 98.999 wt %,
wherein the passivation portion is in a liquid state, is adsorbed on the inner surface of the cylinder, and the passivation portion includes monochlorosilane and/or derivatives thereof,
wherein the inner surface of the cylinder includes a bottom surface, a lower portion of an inner-sidewall, and an upper portion of the inner-sidewall,
wherein the upper portion of the inner-sidewall of the cylinder is provided between the lower portion of the inner-sidewall of the cylinder and the valve, and
wherein the passivation portion covers the bottom surface, the lower portion of the inner-sidewall, and the upper portion of the inner-sidewall of the cylinder.

2. The gas-storage cylinder of claim 1, further comprising:
a storage housing at least partially surrounding the cylinder, the storage housing comprising a temperature control device,
wherein the temperature control device is configured to maintain an interior temperature of the storage housing to a temperature within a range of about −45 degrees Celsius to about 10 degrees Celsius.

3. The gas-storage cylinder of claim 1, further comprising:
a storage housing at least partially surrounding the cylinder; and
a temperature control device disposed outside of the storage housing and configured to maintain an interior temperature of the storage housing to a temperature within a range of about −45 degrees Celsius to about 10 degrees Celsius.

4. The gas-storage cylinder of claim 1, wherein the cylinder comprises:
an outer cylinder; and
an inner cylinder disposed within and making contact with an inner surface of the outer cylinder,
wherein a manganese content of the inner cylinder is greater than a manganese content of the outer cylinder.

5. The gas storage cylinder of claim 1, wherein the cylinder further comprosing silicon of 0.001 wt% to 2 wt%.

6. The gas-storage cylinder of claim 1, wherein the lower portion of the inner-sidewall including a first lower inner-sidewall and a second lower inner-sidewall spaced apart from each other in a first direction, the first direction is parallel to the bottom surface of the cylinder,
wherein the upper portion of the inner-sidewall including a first upper inner-sidewall and a second upper inner-sidewall spaced apart from each other in the first direction, and
wherein a distance between the first and second upper inner-sidewalls of the cylinder is smaller than a distance between the first and second lower inner-sidewalls of the cylinder.

7. A deposition system, comprising:
a gas-storage cylinder, wherein a hull of the gas-storage cylinder includes manganese and iron;
a gas supply pipe connected to the gas-storage cylinder, wherein the gas supply pipe includes manganese; and a passivation portion disposed within and contacting an inner surface of the gas-storage cylinder and ara inner surface of the gas supply pipe,
wherein a manganese content of the hull of the gas-storage cylinder ranges from about 1 wt% to about 2.6 wt%, a valve provided at an entrance of the gas-storage cylinder; and wherein an iron content of the hull of the gas-storage cylinder ranges from about 62 wt% to about 98.999 wt%%, wherein the passivation portion is in a liquid state, is adsorbed on the inner surface of the gas-storage cylinder and the inner surface of the gas supply pipe, and the passivation portion includes monochlorosilane and/or derivatives thereof, wherein the inner surface of the gas-storage cylinder includes a bottom surface, a lower portion of an inner-sidewall, and an upper portion of the inner-sidewall, wherein the upper portion of the inner-sidewall of the gas-storage cylinder is provided between the lower portion of the inner-sidewall of the gas-storag cylinder and the valve, and wherein the passivation portion covers the bottom surface, the lower portion of the i sidewall, and the upper portion of the inner-sidewall of the gas-storge cylinder.

8. The deposition system of claim 7, further comprising a process chamber connected to the gas-storage cylinder by the gas supply pipe.

9. The deposition system of claim 7, truer comprising:
a storage housing at least partially surrounding the gas-storage cylinder, the storage housing comprising a temperature control device,
wherein the temperature control device is configured to maintain an interior tempera e of the storage housing to a temperature within a range of about −45 degrees Celsius to about 10 degrees Celsius.

10. The deposition system of claim 7, further comprising:
a storage housing at least partially surrounding the gas-storage cylinder; and
a temperature control device disposed outside of the storage housing and configured to maintain an interior temperature of the storage housing to a temperature within a range of about −45 degrees Celsius to about 10 degrees Celsius.

11. The deposition system of claim 7, wherein the gas supply pipe further comprising iron of 62 wt % to 98.999 wt %, and
wherein a manganese content of the gas supply pipe ranges from about 1 wt % to about 26 wt %.

12. The deposition system of claim 7, wherein the gas supply pipe comprises:
an outer pipe; and
an inner pipe disposed within, and contacting an inner surface of the outer pipe,
wherein a manganese content of the inner pipe is greater than a manganese content of the outer pipe.

13. The deposition system of claim 7, wherein the gas-storage cylinder further comprising silicon of 0.001 wt% to 2 wt%.

\* \* \* \* \*

UNITED STATES PATENT AND TRADEMARK OFFICE
CERTIFICATE OF CORRECTION

PATENT NO. : 10,883,173 B2  
APPLICATION NO. : 16/200149  
DATED : January 5, 2021  
INVENTOR(S) : Yeonock Han Page 1 of 1

It is certified that error appears in the above-identified patent and that said Letters Patent is hereby corrected as shown below:

On the Title Page

Item (73):  
"Assignee: SAMSUNG ELECTRONICS CO., LTD.  
Suwon-Si (KR)"

Should be changed to:  
--Assignee: SAMSUNG ELECTRONICS, CO., LTD.  
Suwon-Si (KR)  
AND  
SK-MATERIAL CO., LTD.  
Yeongju-Si (KR)--

Signed and Sealed this  
Twenty-first Day of September, 2021

Drew Hirshfeld  
*Performing the Functions and Duties of the*  
*Under Secretary of Commerce for Intellectual Property and*  
*Director of the United States Patent and Trademark Office*